United States Patent [19]

Ayers

[11] Patent Number: 5,158,656
[45] Date of Patent: Oct. 27, 1992

[54] METHOD AND APPARATUS FOR THE ELECTROLYTIC PREPARATION OF GROUP IV AND V HYDRIDES

[75] Inventor: William M. Ayers, Princeton, N.J.

[73] Assignee: Electron Transfer Technologies, Inc., Princeton, N.J.

[21] Appl. No.: 673,478

[22] Filed: Mar. 22, 1991

[51] Int. Cl.$^5$ .............................. C25B 1/02; C25B 9/00
[52] U.S. Cl. .................................... 204/101; 204/103; 204/230; 204/242; 204/284; 204/291; 204/292; 204/293; 204/290 F
[58] Field of Search ................ 204/1.5, 101, 103, 230, 204/278, 284, 291, 292, 293

[56] References Cited

U.S. PATENT DOCUMENTS

| | | | |
|---|---|---|---|
| 1,375,819 | 4/1921 | Blumenberg, Jr. ................. | 204/101 |
| 3,404,076 | 10/1968 | Haycock et al. ..................... | 204/101 |
| 3,732,157 | 5/1973 | Dewitt ............................ | 204/291 X |
| 3,755,128 | 8/1973 | Herwig ............................ | 204/230 |
| 3,870,616 | 3/1975 | Dempsey et al. ................... | 204/230 |
| 4,113,601 | 9/1978 | Spirig ............................ | 204/230 |
| 4,115,238 | 9/1978 | Cipris ............................ | 204/291 X |
| 4,964,966 | 10/1990 | Moreland et al. ................. | 204/291 X |

FOREIGN PATENT DOCUMENTS 197609 9/1976 Japan ................................. 204/230

*Primary Examiner*—Donald R. Valentine
*Attorney, Agent, or Firm*—Ferris M. Stout

[57] ABSTRACT

An electrochemical apparatus and method for supplying volatile hydrides of sufficient purity, at the proper pressure, and in the required volume, for direct introduction into a chemical vapor deposition reactor in which semiconductors are manufactured and doped.

31 Claims, 1 Drawing Sheet

METHOD AND APPARATUS FOR THE ELECTROLYTIC PREPARATION OF GROUP IV AND V HYDRIDES

BACKGROUND OF THE INVENTION

1. Field of the Invention

This invention is in the field of chemical processes and apparatus; more specifically, the electrochemical synthesis and production of Group IV and V volatile hydrides, and a reactor for carrying out the synthesis. The synthesis and the reactor are designed to produce high purity hydrides directly in a chemical vapor deposition reactor.

2. Art Related to the Invention

High purity gases are required for semiconductor fabrication and doping. Often these gases are dangerously toxic. Commercial compressed gas cylinders store gas at several thousand pounds per square inch pressure and contain one to ten pounds of gas. Hence, centralized production, transportation and storage of these materials presents a hazard to those working with them.

The process and apparatus of this invention provides for these dangerous gases to be generated when they are needed and where they are needed. This provides a safe alternative to the use of cylinders of compressed gas in a semiconductor fabrication reactor, by greatly reducing the amount of gas which must be kept on hand.

The following references disclose processes for producing these gases by chemical methods:

Cotton and Wilkinson, "*Advanced Inorganic Chemistry*", Fourth Ed. Wiley Interscience, 1980 and Brauer "*Preparative Inorganic Chemistry*", Academic Press 1963 teach that the Group IV and V hydrides can be produced by chemical reduction of electropositive compounds of the desired product gas element with acids or by the reduction of the halides with $LiAl_4$ or $NaBH_4$. For example:

$$Na_3P + 3 H_2O \rightarrow PH_3 + NaOH$$

$$Mg_3Sb_2 + 6 HCL \rightarrow 2 SbH_3 + 3 MgCl_2$$

$$Na_3As + 3 NH_4Br \rightarrow AsH_3 + 3 NaBr + 3 NH_3$$

$$Mg_2Ge + 4 NH_4Br \rightarrow GeH_4 + 2 MgBr_2 + 4 NH_3$$

$$GeCl_4 + LiAlH_4 \rightarrow GeH_4 + LiCl + AlCl_3.$$

These gases can also be prepared by the electrochemical reductions:

$$Sb + 3 H_2O + 3e \rightarrow SbH_3 + 3 OH-$$

$$As + 3 H_2O + 3e \rightarrow AsH_3 + 3 OH-$$

$$Ge + 4 H_2O + 4e \rightarrow GeH_4 + 4 OH-$$

$$P + 3 H_2O + 3e \rightarrow PH_3 + 3 OH-.$$

In addition, dissolved ionic precursors can be used such as:

$$H_2PO_2- + 5H+ + 4e \rightarrow PH_3 + 2 H_2O.$$

Salzberg, J. *Electrochem. Soc.* 101, 528 (1964) discloses the electrochemical formation of stibine at an antimony cathode. Lloyd, *Trans. Faraday Soc.* 26, 15 (1930) and Salzberg J. *Electrochem. Soc.* 107, 348 (1960) disclose the preparation of high purity arsine at an arsenic cathode. Spasic, *Glas. Hem.. Drus. Beograd.* 28, 205 (1963) discloses the electrochemical production of germanium hydride.

E. W. Haycock and P. R. Rhodes, U.S. Pat. No. 3,404,076 disclose a method for the electrolytic preparation of volatile hydrides. Gordon and Miller in U.S. Pat. No. 3,109,785 and U.S. Pat. No. 3,109,795, Miller and Steingart, U.S. Pat. No. 3,262,871, and Miller U.S. Pat. No. 3,337,443 disclose electrolytic methods for the production of phosphine. Porter in U.S. Pat. No. 4,178,224 discloses an electrochemical method for the synthesis of arsine gas. His method utilizes a dissolved arsenic salt with an oxygen evolving anode. With this method, the arsine concentration is limited to less than 25%. Another limitation of Porter's method is the need to balance pressures and liquid levels in the divided anode and cathode sections of the electrochemical cell. This requires an inert gas supply to the cell.

The application of a potentiostat to an electrolytic cell is ably discussed by Bard and Faulkner in *Electrochemical Methods*, John Wiley and Sons, 1978.

SUMMARY OF THE INVENTION

The invention is an electrochemical process and a reactor for producing volatile hydrides of sufficient purity, and at a proper pressure, for direct introduction into a chemical vapor deposition reactor (hereafter, CVR) used for the manufacture of semiconductors.

The reactor uses a cathode made of purified metal which on reduction will produce the hydride gas desired (plus sometimes hydrogen, which in semiconductor manufacture is considered a diluent, but not a contaminant). It uses an anode which will not evolve contaminating gas when it is oxidized. Molecular sieves in a manifold attached to the reactor remove traces of water vapor. A pressure sensor on the manifold and a microprocessor attached to it maintain pressure in the reactor required by the inlet of the CVR to which it is connected, and provides for a suitable flow of gas into it.

DETAILED DESCRIPTION OF THE INVENTION

Figure 1:
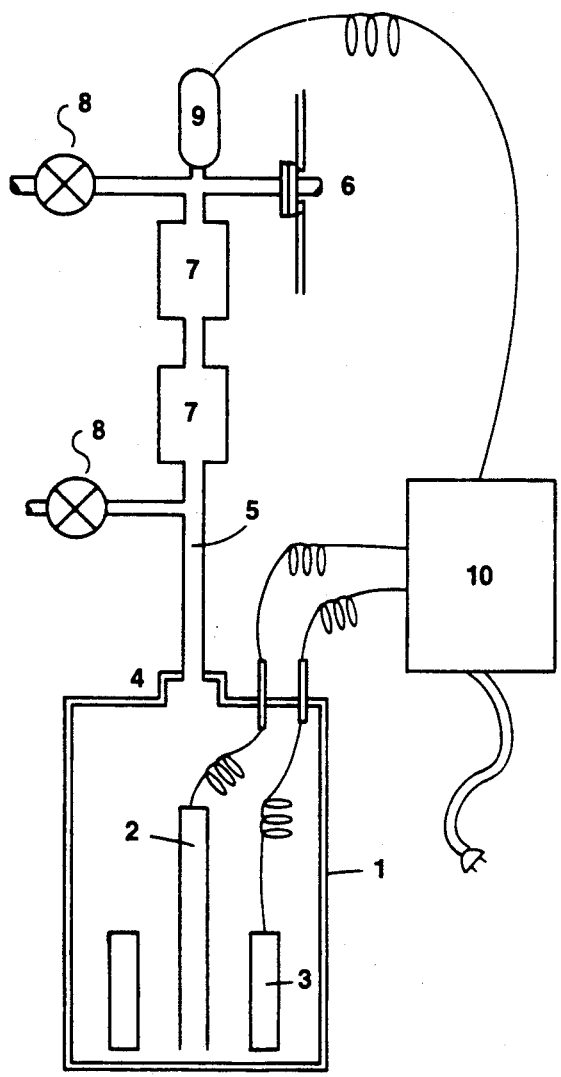
FIG. 1 shows the reactor diagrammatically and in cross-section.

Referring now to FIG. 1, which shows a preferred embodiment of the invention: 1 represents the pressure vessel, preferably lined with an unreactive material like Teflon( TM ). Inside the reactor is an electrolytic cell (described below in detail) having a cathode 2 and an anode 3. The pressure vessel is connected through port 4 and manifold 5 to the inlet of CVR 6 (not a part of this invention), in which hydride gases are used to manufacture, and for doping, semiconductors.

In series along the manifold one or more filters 7, preferably molecular sieves, remove water, solvent vapors, and other impurities from the volatile hydride gas. Solenoid valves 8 in the manifold provide for evacuation of the vessel and the manifold and for purging the system with hydrogen.

In the manifold 5, an electronic pressure sensor 9 detects the pressure in the system and provides a proportional electric signal to a microprocessor 10. The microprocessor compares the signal to a set point and accordingly adjusts the current between the cathode 2 and the anode 3 of the reactor, controlling thereby the rate at which the hydride gas is produced and maintaining constant pressure in the manifold.

In another embodiment of the reactor, a potentiostat limits the maximum current between the cathode and the anode to a value below the current which will cause oxygen evolution at the anode, regardless of the demand of the microprocessor's output signal. The design and operation of potentiostats is well known in the art; Bard and Faulkner, op. cit., give an excellent exposition beginning at page 564.

Figure 2:
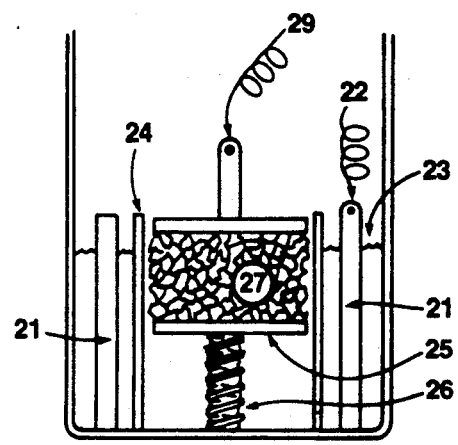
FIG. 2 is a diagrammatic sketch of a preferred embodiment of the electrolytic cell inside the reactor.

FIG. 2 is a diagrammatic cross-section of a preferred embodiment of the electrolytic cell. Anodes 21 with electrical leads 22 are circularly disposed around a cathode assembly. The anodes are immersed in an electrolyte, its upper level at 23. The cathode assembly 24 comprises a vertically disposed cylinder of perforated, non-conducting material. A web of a suitable polymer is preferred. Inside the bottom of the cylinder a lower disc 25 can slide vertically. Lower disc 25 is biased upward by a spring 26. The cylinder is filled with particles of cathodic material 27; for example, 8 mm chunks of antimony. The particles at the top of the cylinder are above the surface of the electrolyte. An upper disc 28 of conductive metal, preferably lead, having electrical leads 29, fits concentrically within the cylinder, contacting the cathodic particles at the top of the cylinder. An electric current imposed between the electric leads will cause electrolysis in the cell.

Since the particles in contact with the upper disc are not immersed in the electrolyte, hydrogen gas will not be generated at the upper disc. On the other hand, those particles below the electrolyte level will decompose, generating as they do so a hydride, arsine in the example, which escapes through the perforations in the cylinder. As the particles decompose, spring 26 forces the residual particles together, maintaining electrical contact between them, so maintaining the electrolytic reaction.

Figure 3:
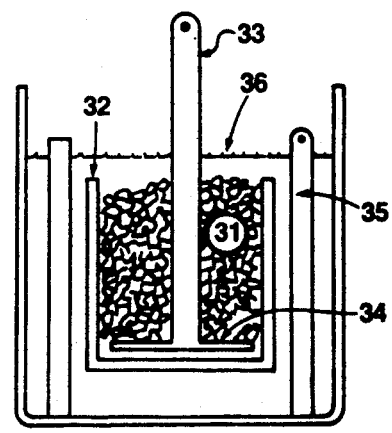

FIG. 3 is a diagrammatic cross-section of another embodiment of the electrolytic cell. In this case the cathode 31 is in the form of particles, shot, or chunks. The cathodic material is contained in a cage 32 of polymeric mesh or perforated sheet. An insulated central cathode lead 33 brings current to a plate of inert metal 34 which forms the bottom of the cathode cage. Electrolyte can circulate freely around the cathode particles, and gas can readily escape as it forms. 35 represents the anode, made of material which will not evolve gases when oxidized, circularly disposed around the cathode. There must be more anode material than cathode material, to insure that the cathode is exhausted before the anode is completely oxidized. Cathode and anode are immersed in an electrolyte, its upper level indicated at 36.

In yet another embodiment of the reactor, the raw material for the cathode reaction is a finely divided slurry of hydride-generating metal in an aqueous electrolyte. A central cathode lead provides negative voltage to the slurry. A fine plastic screen surrounding the slurry supports a microporous separator. In another embodiment the fine screen supports an anion exchange membrane. Concentric with and outside of the screen is a non-oxygen evolving anode. For poorly conductive materials, electrical contact with the slurry is with a high hydrogen overpotential lead. In another embodiment it is a cadmium cathode. An example of this embodiment is phosphorous, in which a slurry of red or black phosphorous powder is contacted with a high hydrogen overpotential lead. Reduction of the phosphorous particles at the cathode results in the production of phosphine and hydrogen.

In still another embodiment, the anode consists of a dissolved chemical species which is oxidized without the evolution of oxygen or other contaminant gases. An example is soluble redox couples such as Fe(EDTA)-/-4 which is oxidized on an inert high oxygen overpotential anode, e.g. smooth platinum or gold, without evolving oxygen.

In a further embodiment the anode is the hydrogen oxygen oxidation anode. In this case an external source of hydrogen is fed to the anode to be oxidized to protons. Some of the hydrogen requirement for the anode could be supplied from the cathode reaction.

In a yet further embodiment, the cathode is made of, or fabricated with, selenium, and is electrolyzed to make hydrogen selenide. Selenium is normally a poor conductor in the dark. In this embodiment, the selenium cathode is illuminated to increase its conductivity and thereby the rate of gas evolution.

The following examples illustrate, but do not define or limit, the invention:

EXAMPLE 1

Arsenic chips of 99.9999% purity and approximately 8 millimeters in size are placed in a packed bed electrochemical cell. A lead rod, 10 millimeters in diameter, feeds current to a lead plate on which the arsenic shot is supported. Four cadmium or molybdenum anodes surround the cathode bed. The electrolyte is 8N KOH. All electrode and electrolyte components are in a Teflon lined, stainless steel vessel. A constant current of 15 amperes is applied between the cathode and anode. The yield of arsine is approximately 45% with the balance consisting of hydrogen. A water vapor removal cylinder filled with Linde (TM) 3A molecular sieve decrease the water vapor content of the evolved arsine to no more than ten parts per million.

EXAMPLE 2

A disk of antimony metal 1 centimeter in diameter is immersed in an electrolyte of 1N $NH_4OH$. The antimony is held at a constant potential of $-4$ volts versus a silver/silver chloride reference electrode. Stibine, antimony hydride, is evolved along with hydrogen. The stibine yield is at least 1%. The addition of a minute concentration of lead sulfate (e.g. $10^{-5}$ Molar) increases the yield to at least 4%. Decreasing the temperature to 5° C. also increases the yield.

EXAMPLE 3

The above antimony disk is immersed in an electrolyte of 1N $Na_2SO_4$ in $H_2O$. The antimony is held at a constant potential of $-5$ V vs Ag/AgCl. The current efficiency for stibine evolution is 0.23%. Substituting $D_2O$ for normal water in the $Na_2SO_4$ electrolyte and operating under the same potential control conditions increases the current efficiency to more than 1%.

EXAMPLE 4

A solid piece of germanium, approximately 10 grams in weight, is fabricated into a cathode by the attachment of a copper wire and an indium contact. The contact and wire are sealed in epoxy and glass and the germanium is immersed into a 1N NaOH electrolyte. A potentiostat holds the cathode at a constant potential of −2 volts vs. a calomel reference electrode. The counterelectrode is a large piece of cadmium. Both hydrogen and germane evolve off the germanium cathode at room temperature. The current efficiency of germanium hydride is approximately 30% with hydrogen forming the balance of the evolved gas.

The above embodiments and examples are recited herein to illustrate the invention and are not be construed as limiting or defining it, which is exclusively accomplished in the Claims.

I claim:

1. In an electrochemical method for producing hydride gases in which a cathode is fabricated from a hydride-forming material and an electric current is imposed between the cathode and an anode, the improvement which comprises
    providing an anode which will oxidize without evolving a gas,
    providing a vessel for containing the reaction capable of withstanding the pressure necessary for supplying gas to a chemical vapor deposition reactor,
    deriving an electric signal proportional to the pressure in the vessel, and
    using the electric signal to control the current between the cathode and the anode, thereby providing for gas flow at a constant pressure.

2. The method of claim 1 which comprises the further improvement of
    removing water vapor and traces of contaminating gases from the hydride gases to the extent necessary for their use in a chemical vapor deposition reactor.

3. The method of claim 1 wherein the gas produced contains no more than 100 parts per million of contaminating gases other than hydrogen.

4. The method of claim 1 wherein the hydride-forming material is configured as a solid cathode of multiple sections.

5. The method of claim 1 wherein the hydride-forming material is configured as a packed bed cathode.

6. The method of claim 1 wherein the hydride-forming material is configured as a slurry of powder in electrolyte.

7. The method of claim 1 wherein the anode material is chosen from the group, lead, cadmium, and indium.

8. The method of claim 1 wherein the anode is a consumable anode chosen from the group molybdenum, tungsten vanadium, chromium, or antimony.

9. The method of claim 1 wherein the anode is a redox anode chosen from the group $MnO_2/MnO_3$, $Fe(OH)_2/Fe_3O_4$, $Ag_2O/Ag_2O_2$, or $Co(OH)_3/Co(OH)_2$.

10. The method of claim 1 wherein the anode is a soluble, oxidizable, ionic species with an oxidation potential less positive than 0.4 volts versus an Hg/HgO reference electrode.

11. The method of claim 1 wherein the anode is a hydrogen oxidation anode.

12. The method of claim 1 wherein the electrolyte is chosen from the group of aqueous electrolytes NaOH, KOH, LiOH or combinations thereof.

13. The method of claim 1 wherein the electrolyte solvent is chosen from the group water, deuterated water ($D_2O$), and mixtures thereof.

14. The method of claim 1 in which the hydride-forming material is a dissolved ionic precursor of the hydride.

15. In an electrochemical reactor of the type comprising a vessel containing a cathode, an anode, and an electrolyte, the improvement comprising
    a cathode selected from those materials capable of generating hydride gases,
    an anode selected from materials which can be oxidized without evolving a contaminating gas,
    reinforcing means in the vessel enabling it to withstand pressures required to supply gas to the inlet of a chemical vapor deposition reactor,
    a manifold on the reactor vessel having means for adsorbing contaminant gases and means for electronically monitoring the pressure in the vessel, and
    electronic means for modulating the current between the cathode and the anode in proportion to the electronic measurement of the pressure in the vessel.

16. The reactor of claim 15 wherein the adsorbing means are molecular sieves.

17. The reactor of claim 15 wherein the potential at the anode is limited by a potentiostatic circuit.

18. The reactor of claim (19) 15 wherein the anode is chosen from the group, molybdenum, tungsten, vanadium, chromium, and antimony.

19. The reactor of claim 15 in which the cathode comprises arsenic, whereby arsine gas is produced.

20. The reactor of claim 15 in which the cathode comprises germanium, whereby germane gas is produced.

21. The reactor of claim 15 in which the cathode is antimony, whereby stibine gas is produced.

22. The reactor of claim 15 in which the cathode comprises selenium, whereby hydrogen selenide gas is produced.

23. In an electrolytic cell adapted to contain an electrolyte and having an anode and a cathode, the improvement which comprises
    a cathode constructed from a molecular mixture of a poorly conducting element and a metal which conducts electricity readily.

24. The cathode of claim 23 in which a fine powder of a poorly conducting element is intimately mixed with a fine powder of a good conductor and the mixture is shaped into a cathode and is sintered.

25. An electrolytic cell for producing hydrogen selenide gas which is adapted to contain an electrolyte and which comprises
    an anode which does not evolve a gas which will contaminate the hydrogen selenide gas when the anode is oxidized,
    a cathode containing selenium, and
    means for illuminating the cathode to increase the conductivity of the selenium.

26. An electrochemical reactor comprising
    a pressure vessel capable of withstanding the pressure required to supply gas to the inlet of a chemical vapor deposition reactor, the vessel being adapted to contain an electrolyte, and having
    a cathode fabricated from a hydride-forming material,
    an anode which will oxidize without evolving a gas which will contaminate the hydride,
    a manifold connected to the vessel,
    means connected to the manifold for absorbing water vapor and contaminating gases other than hydrogen in the hydride gas produced in the reactor, electronic means connected to the manifold for generating an electric signal proportional to the pressure in the vessel, and a microprocessor connected to the electric signal and connected to the cathode and the anode so that the current between the cathode and the anode is modulated in proportion to the electric signal.

27. In an electrolytic cell adapted to contain an electrolyte and having an anode and a cathode, the improvement which comprises a cathode constructed from an atomic mixture of a poorly conducting element and a metal which conducts electricity readily.

28. The cathode of claim 27 in which an element selected from the group of elements antimony, arsenic, phosphorous and selenium is alloyed with a metal selected from the group cadmium, lead, mercury and zinc.

29. The cathode of claim 27 in which the atomic mixture is an alloy.

30. The cathode of claim 27 in which the atomic mixture is a solid solution.

31. In a cathode for an electrolytic cell which has an anode with an electrical contact and which is adapted to be filled to a fixed level with an electrolyte, the improvement which comprises a vertically disposed, nonconducting, perforated cylinder, the top of the cylinder being above the fixed level;

a lower disc slidably disposed in the bottom of the cylinder;

means disposed below the lower disc to urge it upwards in the cylinder;

particles of cathodic material filling the cylinder to its top;

an upper disc of conducting material in contact with the cathodic particles at the top of the cylinder, whereby those particles which are above the fixed level will not be wet by the electrolyte; and electrical contact means on the upper disc whereby an electric current can be imposed between the anode and the cathode assembly.

* * * * *